United States Patent [19]

Gale

[11] Patent Number: 4,807,171
[45] Date of Patent: Feb. 21, 1989

[54] DIGITAL PHASE ROTATION OF SIGNALS
[75] Inventor: Simon J. Gale, Bishops Stortford, England
[73] Assignee: STC plc, London, England
[21] Appl. No.: 842,119
[22] Filed: Mar. 20, 1986
[30] Foreign Application Priority Data
Mar. 22, 1985 [GB] United Kingdom ............... 8507552
[51] Int. Cl.⁴ .................... H03H 17/08; G01S 5/14
[52] U.S. Cl. ................ 364/715.01; 364/715.07
[58] Field of Search ........... 364/715, 443, 726, 730, 364/731; 340/727; 342/185

[56] References Cited

U.S. PATENT DOCUMENTS 3,927,312  12/1975  Dickinson ............... 364/726 X
4,231,102  10/1980  Barr et al. ............... 364/726
4,601,005  7/1986   Kilvington ............... 364/602

FOREIGN PATENT DOCUMENTS 2140600  11/1984  United Kingdom ............... 364/726

Primary Examiner—Gary V. Harkcom
Assistant Examiner—Tan V. Mai
Attorney, Agent, or Firm—Lee & Smith

[57] ABSTRACT

A method and apparatus for effecting phase rotation of a digital signal by applying said digital signal as partial address signals for a look-up table in a memory together with rotation control signals forming additional address signals whereby the memory output represents the phase rotated signal, characterized in that each input vector is modified so that points representing digitized input vector values plotted on a rectangular coordinate grid are transformed to lie on an alternative coordinate system and the rotated vectors are retransformed and requantized to a digital output.

2 Claims, 7 Drawing Sheets

0° ROTATION

5·625° ROTATION

45° ROTATION

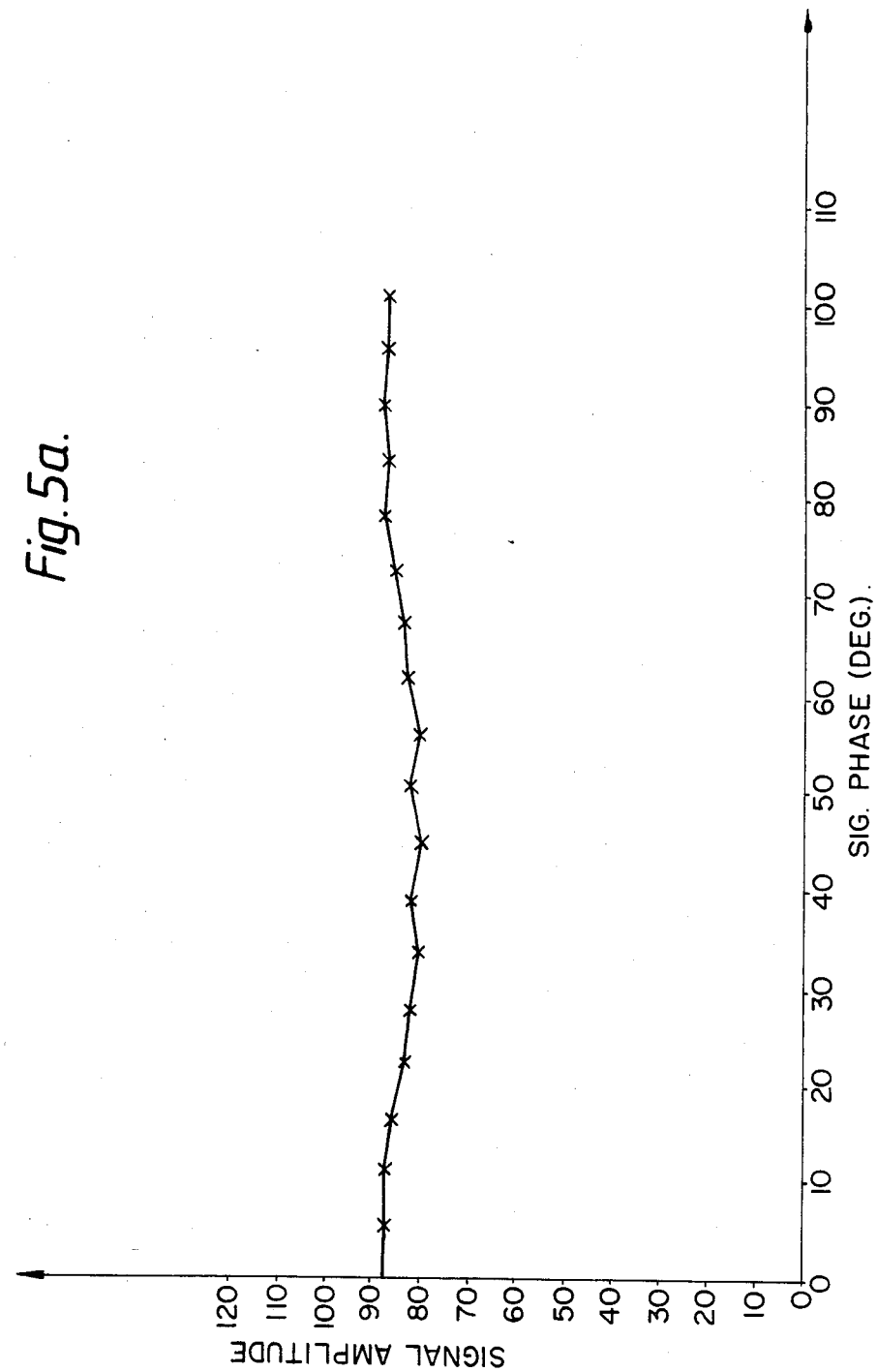

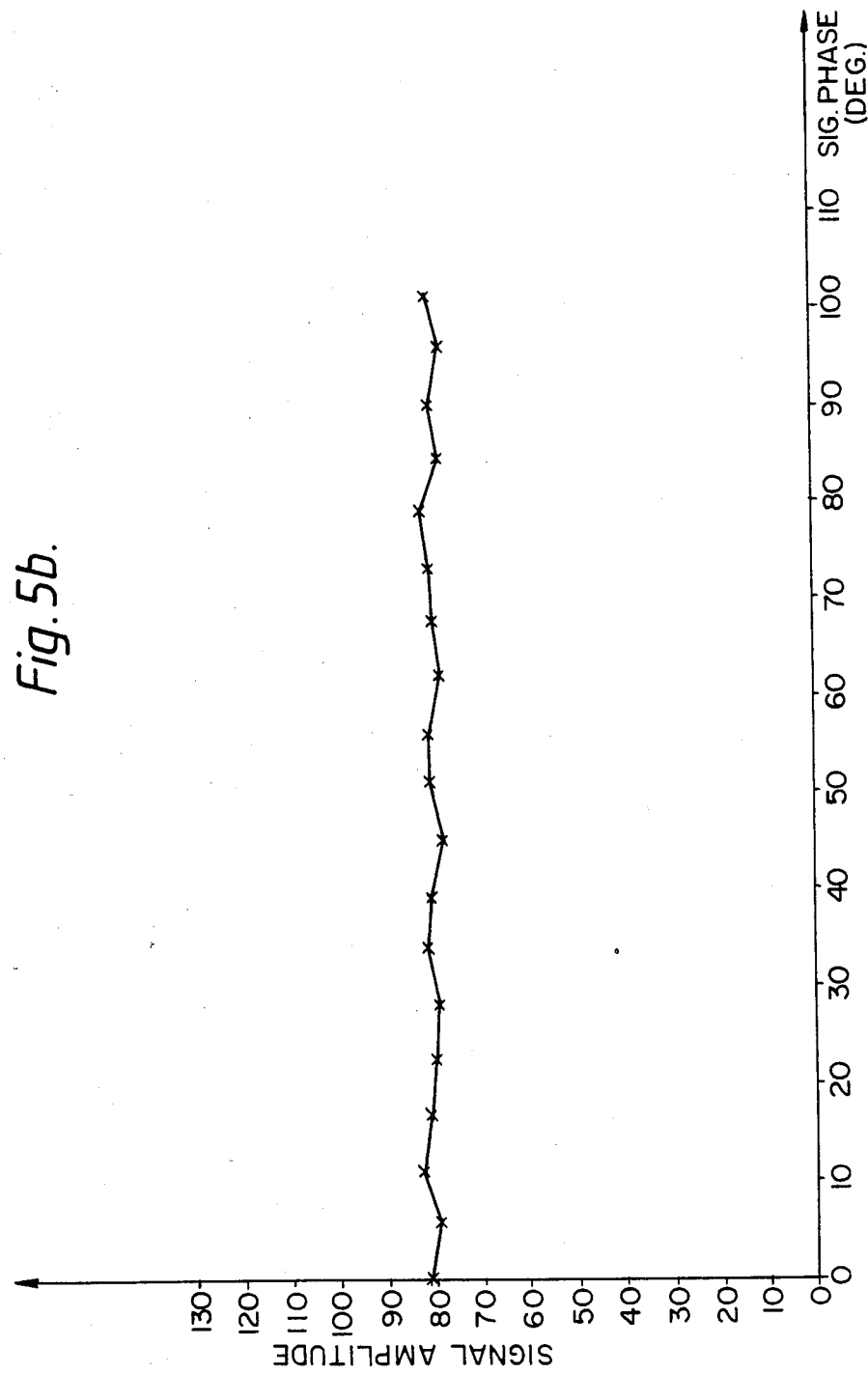

DIGITAL PHASE ROTATION OF SIGNALS

BACKGROUND OF THE INVENTION

This invention relates to a method and means for effecting digital phase rotation of signals and is especially useful in electronic navigation systems.

A recent development in navigation is a system known as NAVSTAR, utilizing a number of earth satellites.

The complete Navstar system is planned to consist of 18 satellites arranged in nearly circular orbits with radii of 26,600 km, and an inclination to the earth's equatorial plane of 55 degrees. Each satellite transmits two navigation signals, designated L1 and L2 and centred at 1575 and 1228 MHz respectively.

Both signals convey ranging information by means of modulations which are locked in time to atomic standards. The forms of these modulations (which are known as pseudorandom codes because they appear random, but are nevertheless well defined) are unique to each satellite.

By measuring the phases of the received codes against a clock in the receiver, together with the Doppler shifts of the radio frequency carriers, a user can calculate the range and range rate to a particular satellite by monitoring four satellites. By decoding data about their motions which are also modulated on to the transmitted signals, the user may solve equations to determine his three-dimensional position and velocity and also apply corrections to his clock, making it conform to satellite time.

Two pseudorandom codes are in fact transmitted by each satellite. The first of these is used to aid acquisition of the satellite signals and to provide coarse navigation, and hence is called the Coarse/ Acquisition (C/A) code. The second has a 10-times higher modulation rate which yields the full navigational accuracy of the system, and is designated the Precision (P) code.

A basic Navstar receiver typically contains a low-noise amplifier and down-converter to a convenient IF, followed by one or more code and carrier tracking channels, each capable of tracking the transmissions from any satellite. There is also associated range and range-rate measurement circuits.

The purpose of the code tracking loop is to keep a code generator in the receiver in step with a received pseudorandom sequence, and hence provide information on the range to the satellite being tracked.

One implementation of a NAVSTAR receiver includes amplification of the received r.f. (radio frequency) signals and down conversion to i.f. (intermediate frequency) frequencies to produce quadrature signals, analogue-to-digital converters to digitize separately the quadrature signals, local digital code generating means, means for correlating the digitized quadrature signals separately with the same locally generated digital codes, channel signal processing means to which the outputs of the correlation means are applied, the processing means being arranged to control the code and carrier tracking of the receiver, and correction means responsive to control signals generated in the processing means to effect phase rotation of the baseband signal phasor represented by the quadrature signals to effect Doppler tracking in the receiver loop. The receiver includes a digital data memory means loaded with data in the form of "look-up" tables incorporating combinations of signal input conditions, means for applying the digitized quadrature signals as partial address signals for the memory means, and means for generating additional address signals for the memory means in response to the control signals whereby phase rotation correction is effected by accessing the memory means in accordance with the address signals to produce an output signal for the channel signal processing means.

Simulation to evaluate the phase accuracy and signal-to-noise performance of the phase rotator has shown that the phase errors and consequent output signal level modulation increase significantly the rms (root mean square) tracking error of a Costas loop phase tracking operation in the receiver.

A transformation is required on the digitized I and Q vectors. This can be implemented by incorporating a modification in the phase rotation look-up table. The problems to be overcome arise because of the compressions and truncations involved in rotating a uniformly arranged square grid of points within a square grid of requantization boundaries.

SUMMARY OF THE INVENTION

According to the present invention there is provided a method of effecting phase rotation of a digital signal by applying said digital signal as partial address signals for a look-up table in a memory together with rotation control signals forming additional address signals whereby the memory output represents the phase rotated signal, characterized in that each input vector is modified so that points representing digitized input vector values plotted on a rectangular coordinate grid are transformed to lie on an alternative coordinate system and the rotated vectors are retransformed and requantized to a digital output.

BRIEF DESCRIPTION OF THE DRAWINGS

Embodiments of the invention will now be described with reference to the accompanying drawings, wherein:

FIGS. 5a and 5b illustrate output signal amplitudes from phase rotated signals.

DESCRIPTION OF THE PREFERRED EMBODIMENTS

Figure 1:
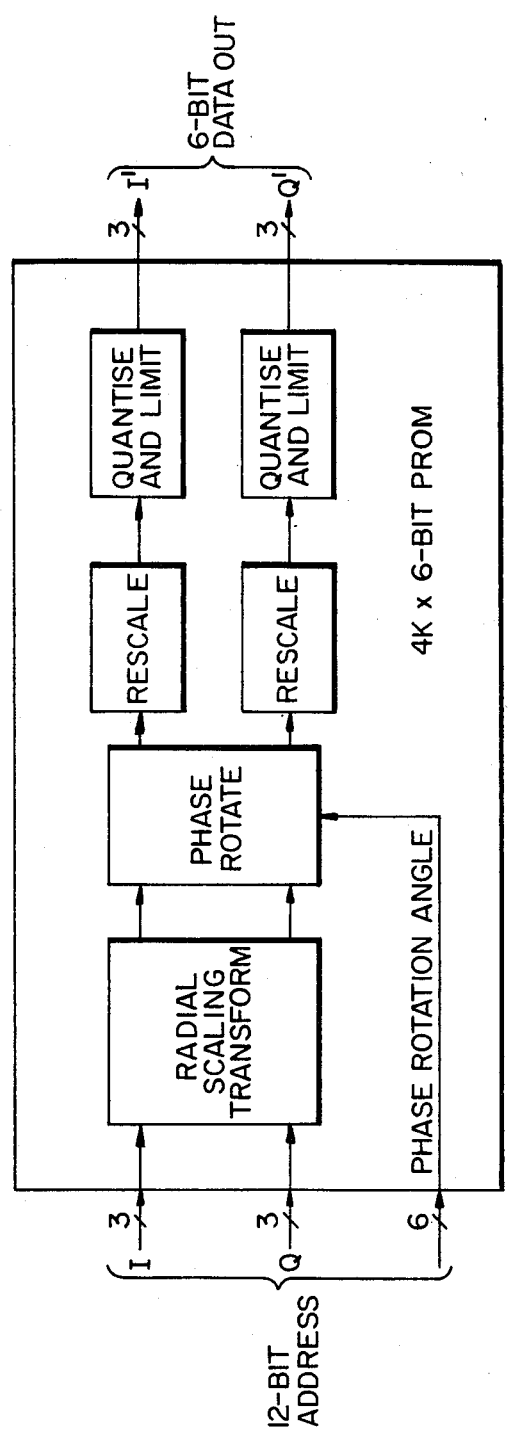
FIG. 1 illustrates phase rotation or quadrature signals using look-up tables.

In the arrangement of FIG. 1 an input analogue signal is first converted into quadrature components and digitized (by conventional means) to provide I and Q channel inputs of, say, 3 bits each. The I and Q signals are applied to a programmable-read-only-memory (PROM), together with a further 6-bit signal representing the required phase rotation angle. The PROM is loaded with look-up tables whereby the input signals are used to address locations in the PROM. The data read out as a result of such addressing is two 3-bit signals I' and Q' representing the phase rotated channel signals.

The functions performed by the look-up tables in the PROM can be summarized as follows:

(1) radial scaling transformation on the digitized I & Q signals, (2) phase rotation of the scaled signals, (3) rescaling of the rotated signals, and (4) requantization of the rescaled signals.

Figure 2A:
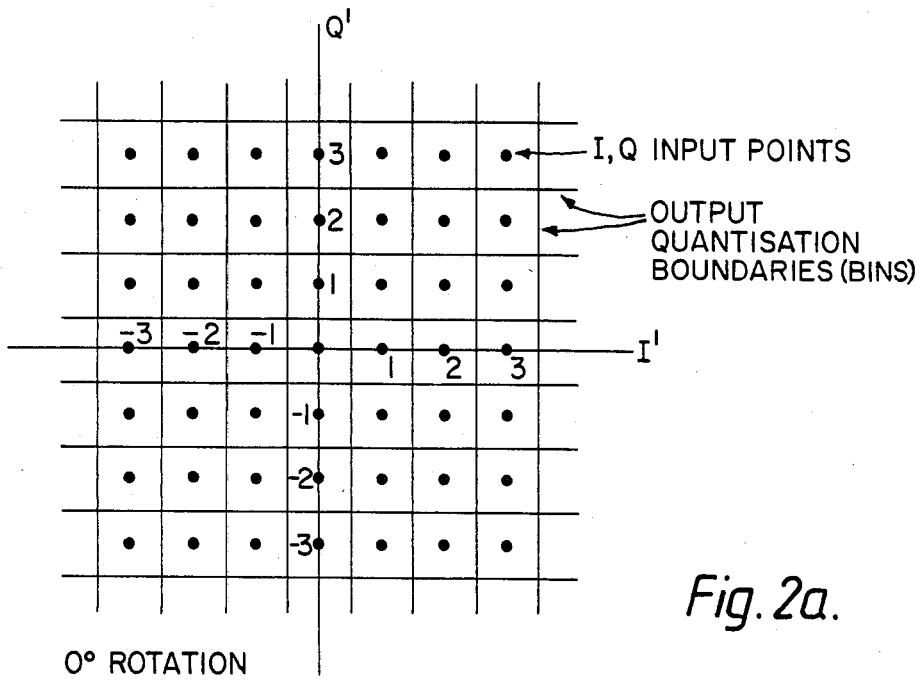
FIGS. 2a–2c illustrate phase rotator input/output mappings.

Consider first the representation of the digitized I and Q signals as vectors as shown in FIG. 2a. Each point represents a digitized I or Q vector. The boxes defined by the orthogonal grid lines can be regarded as "bins", i.e. the grid lines are requantization boundaries where the rotated I & Q values are assigned digital output values consistent with the required number of output bits. FIG. 2a shows the case where the phase rotation angle is zero, i.e. it represents the input values for the digitized I & Q signals and also, by definition, the output values. In this case there is a one-to-one correspondence between the input and output values and no phase errors will be generated.

Figure 2B:
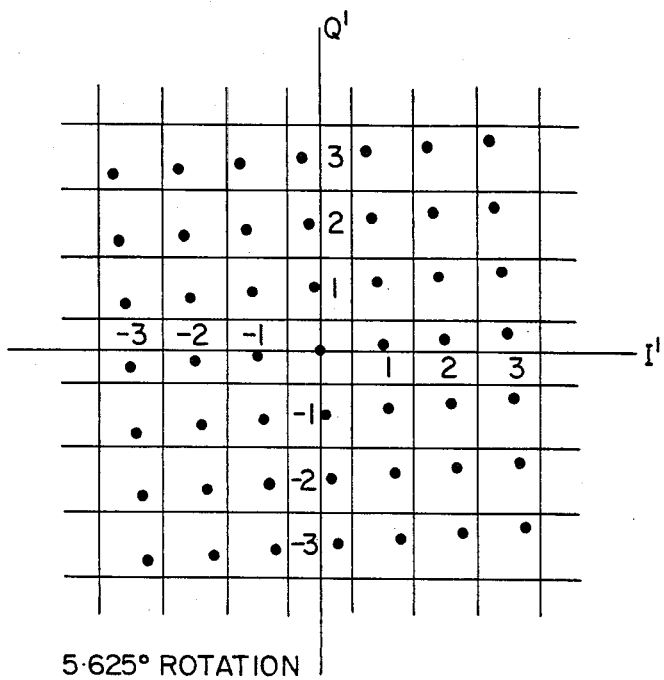
Figure 2C:
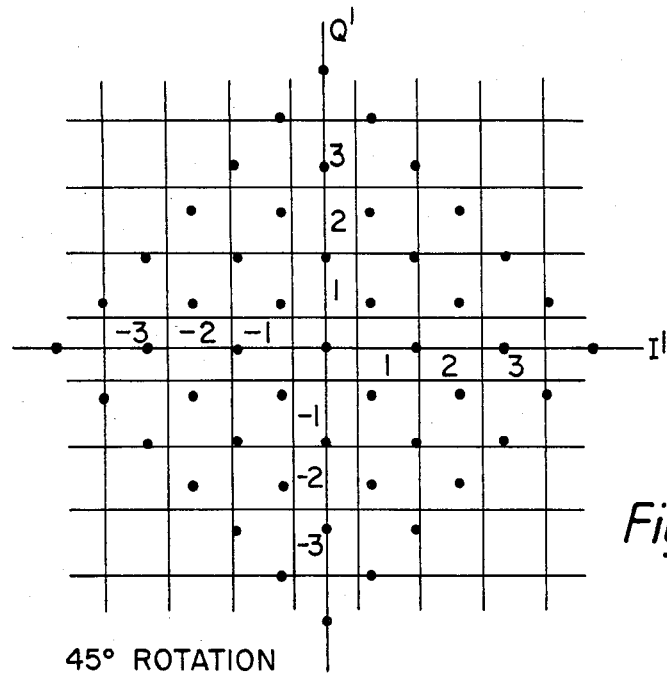
Figure 4A:
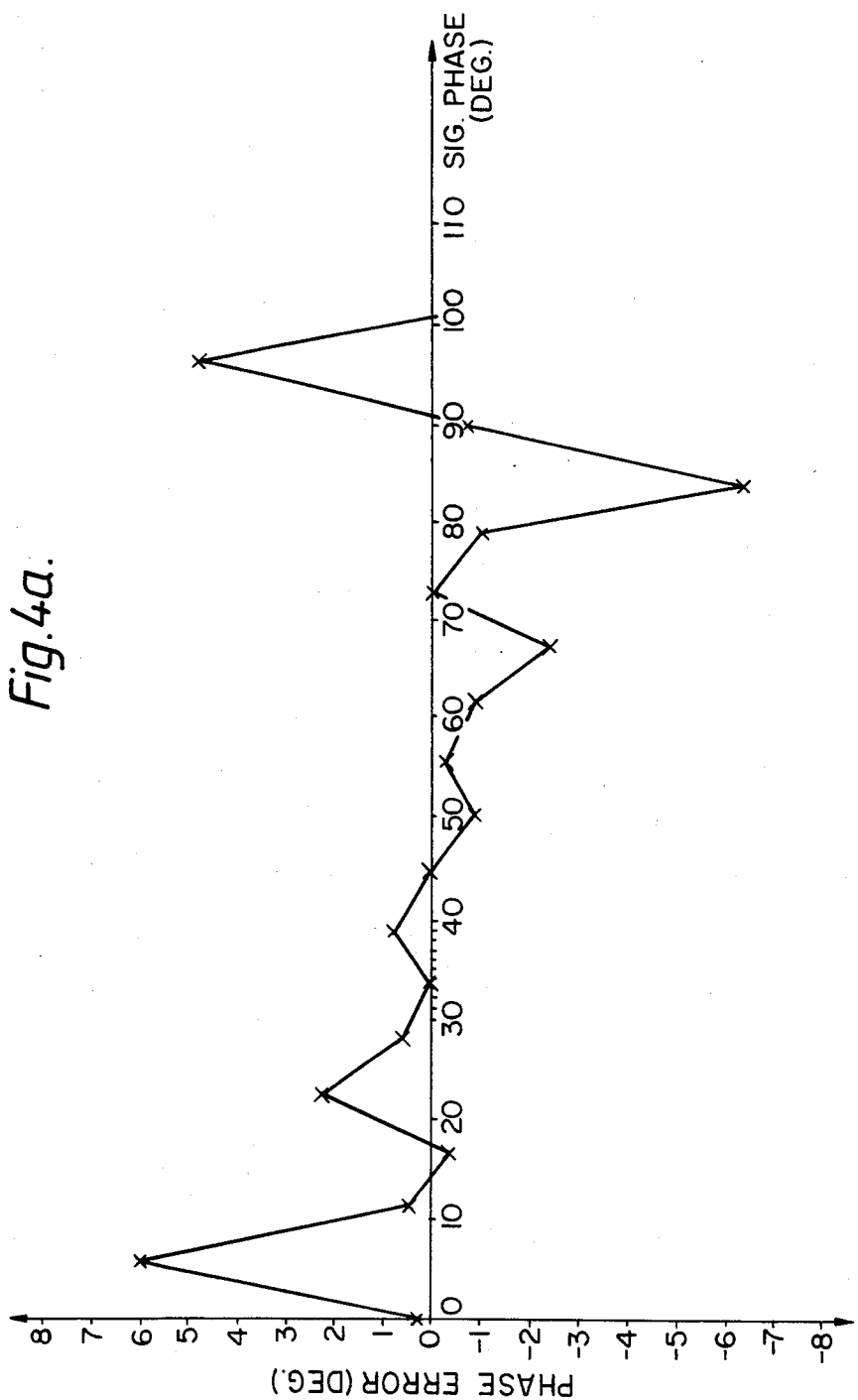
FIGS. 4a and 4b illustrate phase errors in phase rotated signals.

Consider now the case where a small phase rotation is required, e.g. 5.625, which will be assumed to be the minimum phase angle. FIG. 2b shows the situation then obtaining. Although the plot of input points has been rotated by 5.625° it can be seen that none of the rotated vectors has moved into a new output bin, thus there will still be a one-to-one correspondence with the digital values of the input vectors. The minimum phase rotation required to moe a point into an adjacent bin can also be defined in terms of "dead bands", that is the distance a given point has to move before entering an adjacent bin. The dead bands can be notionally indicated by drawing a line through a line of points parallel to a grid line. The space between the two lines constitutes a dead band. For each point in FIG. 2a there will be two dead bands, either vertical or horizontal depending on which quadrant the point is in and whether phase rotation will cause the point to move predominently vertically or horizontally. For this reason there will be phase errors in the output, and from FIG. 4a it will be seen that the maximum phase error near 0° and 90° will reach ±6° (as determined by a computer simulation). The smaller phase errors are likewise produced by similar dead bands resulting from the requantization. FIG. 5a shows the signal levels when the requantized signals are accumulated. An undesirable modulation effect can be observed as the signal phase changes. This effect and the phase erors around 0° and 90° can be clearly understood by reference to FIGS. 2a and 2b. The modulation effect can be most understood qualitatively by referring to FIG. 2c where a rotation angle of 45° is shown. It can be seen that the 'corners' of the original set of I,Q vectors are truncated and also that there are no possible values to go in the corners of the output sets. A compression process has therefore taken place and the output power has consequently been reduced.

Figure 3:
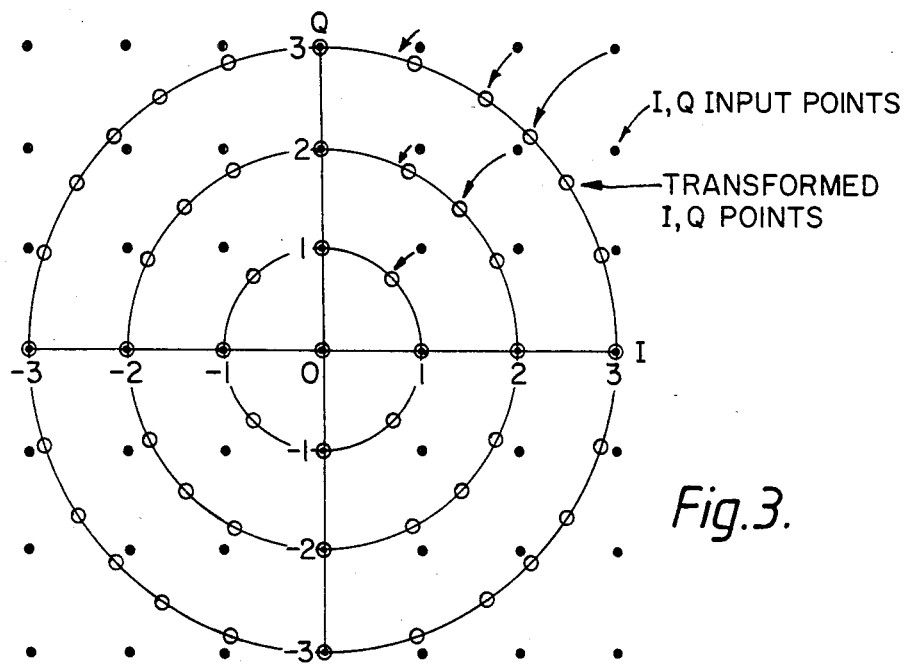
FIG. 3 illustrates scaling of input vectors.
Figure 4B:
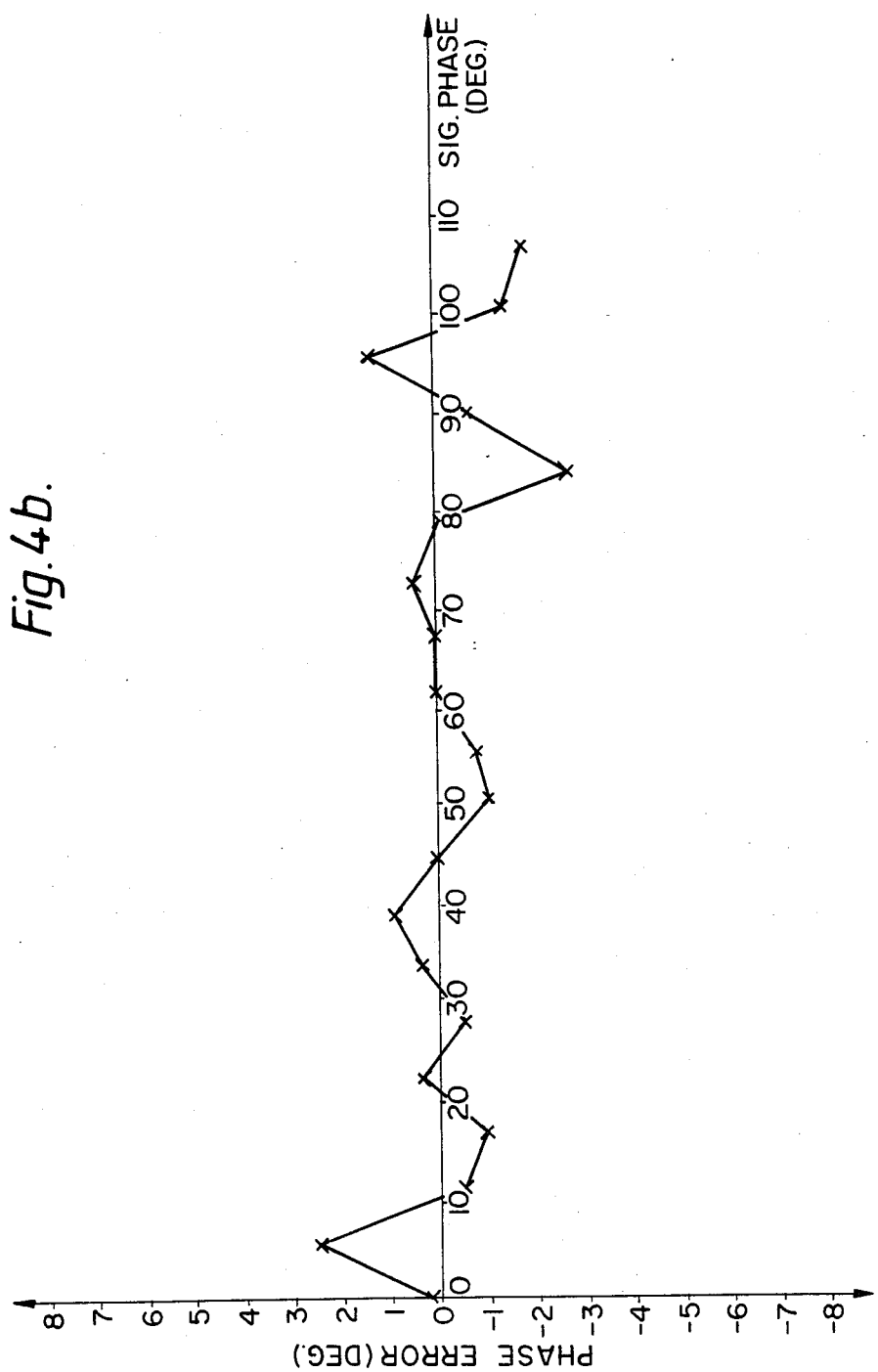

To reduce the effect of phase errors in the phase rotation a radial scaling transformation is effected on the digitized input I & Q vectors. The transformation is incorporated in the PROM look-up tables. The square grid of input points is transformed into a circular pattern, as shown in FIG. 3. The phase of each input vector is retained but its magnitude is scaled so that the points originally on the periphery of the square grid now lie on a circle. The inner points are scaled proportionately to the compression of the outer points for each given phase angle. Once the radial scaling has been effected any degree of phase rotation can be imposed without introducing any significant phase error. After rotation has been effected the resulting vectors are then linearly rescaled before requantization to a digital output so that the I & Q points now lie close to the boundaries of the output quantizer. As a result much lower phase errors are created. FIG. 4b shows the phase errors recurring in the simulation using the radial scaling transformation. The maximum phase error is now ±2.8° and the modulation effects are significantly reduced as can be seen from FIG. 5b.

I claim:

1. A method of effecting phase rotation of a digital signal represented as digitized quadrature I and Q signal vectors by applying said digitized signal vectors as partial address signals to a look-up table in a memory together with digitized phase rotation signals forming additional address signals, the memory having an output representing digitized I' and Q' signal vectors of the phase rotated digital signal, characterised in that each signal vector input to the memory is modified so that points representing digitized input vector values plotted on a rectangular coordinate grid are transformed by scaling to lie on a circular co-ordinate system before phase rotation and each phase rotated modified signal vector is retransformed by scaling and requantizing to values plotted on a rectangular co-ordinate grid corresponding to the output of the lookup table.

2. Apparatus for effecting phase rotation of a digital signal represented as digitized quadrature I and Q signal vectors including a memory containing a look-up table, means for applying said digitized signal vectors as partial address signals to said look-up table in the memory, means for applying additional digital address signals representing a required phase rotation angle to the look-up table in the memory, the memory including means responsive to combination of the partial address and additional address signals to select and read out part of the look-up table, the read out from the look-up table representing the phase rotated signal vector values, characterised in that the look-up table incorporates scaling factor means to radially scale the magnitude of each input vector while maintaining the phase of the input vector so that points representing the digitized input values plotted on a rectangular co-ordinate grid are transformed by scaling to lie on a circular co-ordinate system before phase rotation and each phase rotated signal vector is retransformed by scaling and requantizing to values plotted on a rectangular grid corresponding to the output of the look-up table.

* * * * *